(12) United States Patent
Kim

(10) Patent No.: US 6,300,192 B1
(45) Date of Patent: Oct. 9, 2001

(54) METHOD FOR FABRICATING A DRAM CELL CAPACITOR USING HEMISPHERICAL GRAIN (HSG) SILICON

(75) Inventor: Yong-Hyuk Kim, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/458,462

(22) Filed: Dec. 9, 1999

(30) Foreign Application Priority Data

Dec. 16, 1998 (KR) .................................................. 98-55501

(51) Int. Cl.⁷ ................................................ H01L 21/8242
(52) U.S. Cl. ............................................. 438/255; 438/398
(58) Field of Search .................................. 438/253–256, 438/396, 399

(56) References Cited

U.S. PATENT DOCUMENTS 5,909,625 * 6/1999 Lim ........................................ 438/398
6,221,711 * 4/2001 Roberts et al. ....................... 438/239

* cited by examiner

*Primary Examiner*—Jey Tsai
(74) *Attorney, Agent, or Firm*—Marger Johnson & McCollom, P.C.

(57) ABSTRACT

A stacked DRAM cell capacitor having HSG silicon only on a top portion of a storage node, not on a bottom portion thereof. The storage node has a double layer structure including a bottom layer and a top layer. The bottom layer is made of a conductive material that suppresses the growth of HSG seeds. Accordingly, electrical bridges between adjacent storage nodes, particularly at a bottom portion, can be prevented.

21 Claims, 7 Drawing Sheets

METHOD FOR FABRICATING A DRAM CELL CAPACITOR USING HEMISPHERICAL GRAIN (HSG) SILICON

BACKGROUND OF THE INVENTION

1. Field of the Invention

The present invention relates to a DRAM cell capacitor and, more particularly, to a method for fabricating a DRAM cell capacitor having HemiSpherical Grain (HSG) silicon on a storage node, wherein a bottom portion thereof has no HSG so as to prevent electrical bridges between adjacent storage nodes.

2. Description of the Related Art

Recent advances in the miniaturization of integrated circuit devices, such as high density DRAMs, have reduced the wafer area available for each individual memory cell. Yet, even as the footprint (an area of a silicon wafer allotted for individual memory cells) shrinks, the storage node must maintain a certain minimum charge storage capacity, determined by design and operational parameters to ensure reliable operation of memory cell. It is thus increasingly important that capacitors have a high charge storage capacity per unit area of the wafer. Accordingly, several techniques have been recently developed to increase the total charge capacity of the cell capacitor without significantly affecting the wafer area occupied by the cell.

Traditionally, capacitors integrated into memory cells have been patterned after the parallel plate capacitor. An inter-electrode dielectric material is deposited between two conductive layers that form the capacitor plates or electrodes. The amount of charge stored on the capacitor is proportional to the capacitance. $C = \in \in_0 A/d$, where $\in$ is the dielectric constant of the capacitor dielectric, $\in_0$ is vacuum permittivity, A is the electrode area, and d represents the spacing between electrodes. Some techniques for increasing capacitance include the use of new materials having high dielectric constants.

Other techniques have focused on increasing the effective surface area ("A") of the electrodes by modifying the surface morphology of the polysilicon storage electrode itself by engraving or controlling the nucleation and growth condition of polysilicon. An HSG polysilicon layer can be deposited over a storage node to increase a surface area and capacitance.

U.S. Pat. No. 5,623,243 by Watanabe et al. entitled as "SEMICONDUCTOR DEVICE HAVING POLYCRYSTALLINE SILICON LAYER WITH UNEVEN SURFACE DEFINED BY HEMISPHERICAL OR MUSHROOM LIKE SHAPE SILICON GRAIN" is incorporated herein by reference. U.S. Pat. No. 5,741,734 by Young Jung Lee, U.S. Pat. No. 5,634,974 by Ronald A et al., U.S. Pat. No. 5,798,298 by Kiyoshi Mori et al., the disclosures of which are incorporated by reference herein, discloses capacitors with rough surface morphology.

Conventional methods for fabricating a DRAM cell capacitor with HSG silicon are described as follows: depositing a storage electrode layer, patterning the storage electrode layer to form a storage electrode; forming an HSG silicon layer; forming a dielectric layer such as $Ta_2O_5$; forming a plate electrode layer, and patterning the plate electrode layer.

If a design rule of 0.15 micrometers or less is used, a polysilicon layer for the storage node must be formed thick to obtain a desired capacitance in a given cell area. The patterning of such thick polysilicon layer is very difficult and causing a problem associated with slope etching. As schematically illustrated in FIG. 1, an electrical bridge at the bottom portion of the patterned storage node can be generated due to a polysilicon tail (see reference number 22) caused by slope etching. Furthermore, when HSG silicon is formed on the patterned polysilicon layer (i.e., storage node), aforementioned electrical bridge can be generated extensively (see reference number 23).

Accordingly, overetching is required to remove the polysilicon tail. Such overetching can make the neck portion of the resulting storage node thin (see reference number 24 of FIG. 2) when misalignmentcan occurs. In severe cases, the storage node may fall down.

Accordingly, there is a strong need for a method for fabricating a DRAM cell capacitor with increased surface areas without causing an electrical bridge and falling down of the storage node.

SUMMARY OF THE INVENTION

The present invention was made in view of the above problems, and the present invention is directed toward providing a method for fabricating a DRAM cell capacitor with HSG silicon on its surface.

One of the features of the present invention is the formation of a storage node having a double layer structure. The bottom layer of the storage node is made of polysilicon that suppresses the growth of HSG seeds. Alternatively, the bottom layer can be formed of an amorphous silicon layer. Then, an annealing process is performed in order to transform the amorphous silicon layer into a polysilicon layer so as to suppress the growth of HSG seeds. The top layer of the storage node is made of a material, such as an amorphous silicon layer, which allows the growth of the HSG seeds thereon. Accordingly, an electrical bridge between adjacent storage nodes, particularly at a bottom portion thereof, can be prevented.

The storage node has a good sidewall profile without a tail phenomenon encountered in the conventional art because the bottom layer and top layer of the storage nodes are made of different layers. Accordingly, sufficient overetching can be implemented so that no electrical bridge at the bottom portion of the storage node can be formed.

In accordance with the present invention, the capacitor is comprised of a stacked storage node having a double layer structure, a dielectric film and a plate node. The staked storage node is made of a bottom layer and a top layer. The bottom layer is made of a material that suppresses the growth of HSG seeds. The bottom layer is formed to a thickness of about 1,000 angstroms to about 2,000 angstroms. For example, the bottom layer is made of polysilicon. Also, the bottom layer can be made of amorphous silicon that is annealed subsequently in order to prevent the growth of HSG seeds thereon. The top layer of the storage node is formed of a material that allows the growth of HSG seeds thereon. Therefore, HSG silicon is formed on the top layer. The top layer is formed to a thickness greater than the thickness of the bottom layer. For example, the top layer is formed to a thickness of about 8,000 angstroms to about 10,000 angstroms.

According to the present invention, the stacked capacitor is provided by forming an interlayer insulating layer a semiconductor substrate. The semiconductor substrate includes a transistor thereon. The transistor is comprised of a gate electrode, a capping layer, sidewall spacers and source and drain regions. The transistor and the semiconductor substrate are electrically insulated by a gate oxide layer disposed therebetween.

Selected portions of the interlayer insulating layer are etched to form contact holes for contacting one of the source and drain regions. A first conductive material for the bottom layer of the storage node is deposited in the contact hole and on the interlayer insulating layer. The first conductive material suppresses the growth of HSG seeds. The deposited first conductive material is then planarized. The planarized first conductive material on the interlayer insulating layer has a thickness of about 1,000 angstroms to about 2,000 angstroms. Using a photolithographic process, the planarized first conductive material is patterned to form a first conductive pattern to be electrically connected to one of the source and drain regions. This first conductive material is formed of polysilicon. A second conductive layer is formed on the resulting structure. The second conductive layer is then patterned to form a second conductive pattern, defining the staked storage node together with the underlying first conductive pattern. The second conductive pattern is formed of a material that allows the formation of HSG seeds. For example, amorphous silicon may be used. Subsequently, an HSG silicon layer is formed only on the second conductive pattern through HSG seeding and growing by heat treatment.

A dielectric film and a plate node are sequentially deposited on the resulting structure to form a capacitor.

In the above method, the first conductive material may be formed of amorphous silicon. In this case, the deposited amorphous silicon layer needs to be transformed into a crystalline structure, i.e.,a polysilicon layer so as to suppress the growth of HSG seeds. For this purpose, an annealing process may be carried out in a nitrogen ambient at a temperature of about 750° C. for about 10 minutes. Such an annealing process can be carried out at any time after the deposition of the first conductive material and before the deposition of the second conductive layer. By forming an HSG silicon layer only on a top portion, not on the bottom portion of the storage node, the surface area of the storage node can be increased and the electrical bridge at the bottom portion can be inherently prevented.

Alternatively, the planarization of the first conductive material can be carried without leaving the first conductive material on the interlayer insulating layer. Namely, a contact plug is formed using a planarization process. Then, another conductive material, which suppresses the growth of HSG seeds, is deposited to a thickness of about 1,000 angstroms to about 2,000 angstroms and patterned to be electrically connected to the contact plug. A second conductive material is then deposited and patterned to form a second conductive pattern. The second conductive pattern, together with the underlying conductive material pattern, defines the storage node. Subsequently, an HSG silicon layer is formed only on the second conductive pattern using a conventional method.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

Figure 1:
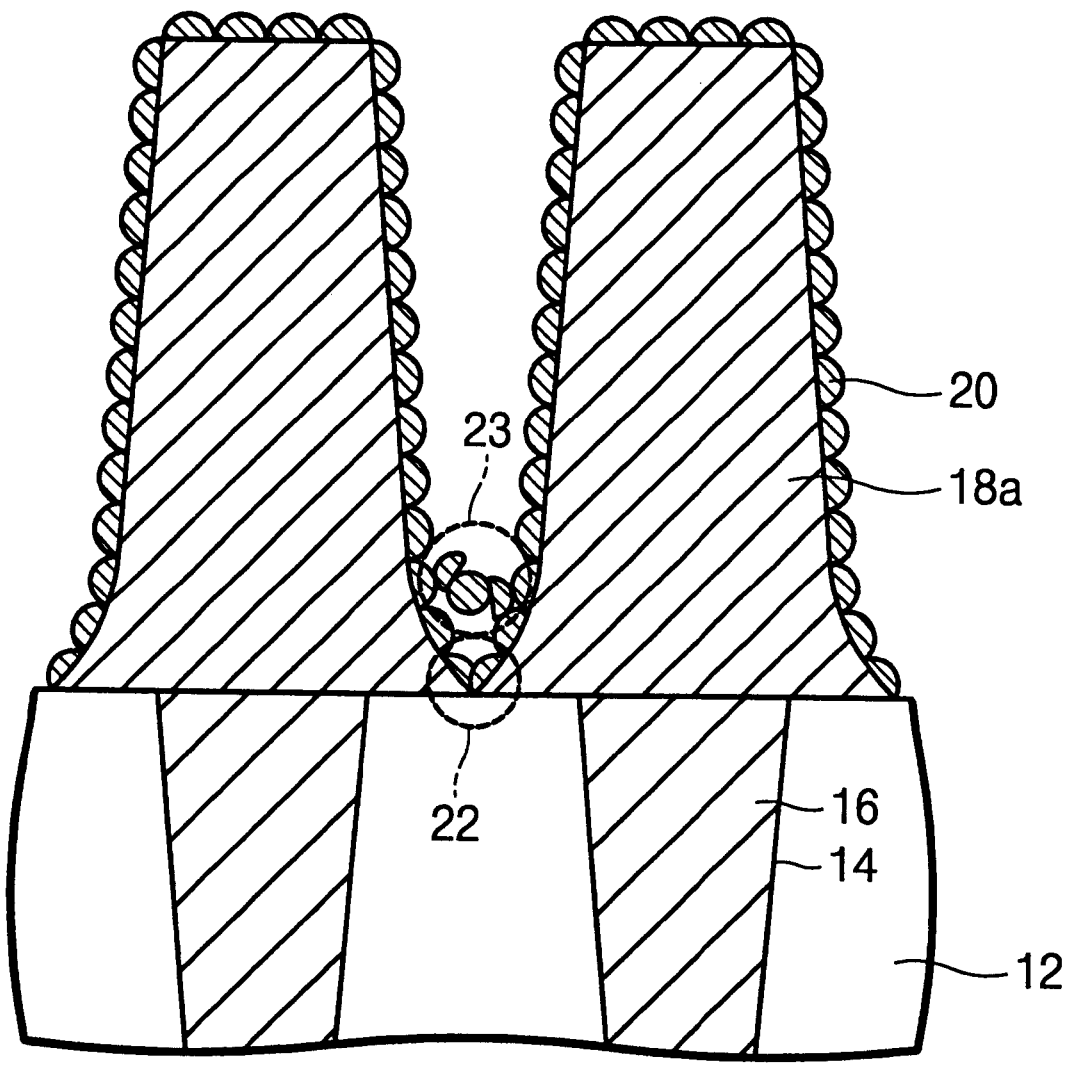
FIG. 1 is a cross-sectional view of a storage node illustrating an electrical bridge between adjacent storage nodes at a bottom portion.
Figure 2:
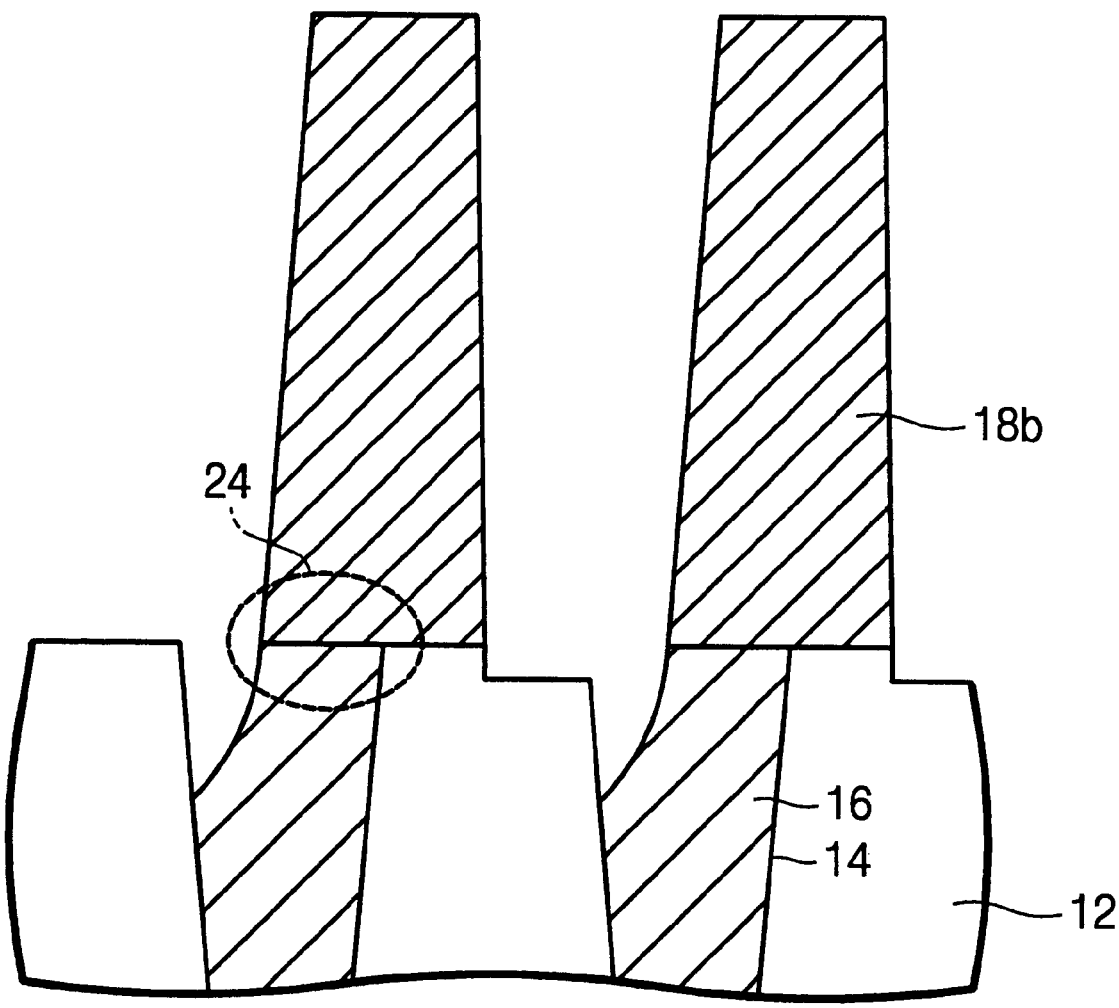
FIG. 2 is a cross-sectional vies of a storage node illustrating a necking phenomenon due to overetching.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, the layer can be directly on the other layer or substrate or intervening layers may also be present. Moreover, each embodiment described and illustrated herein includes its complementary conductivity type embodiment as well.

Figure 3A:
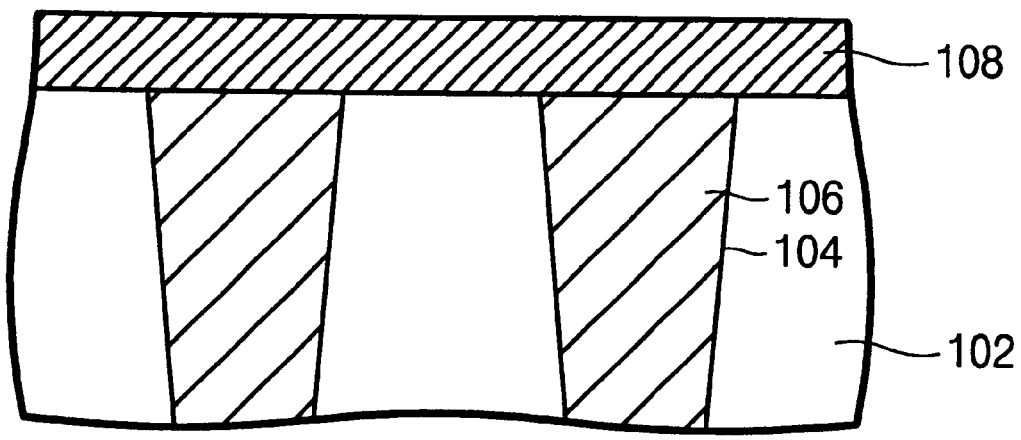
FIGS. 3A to FIG. 3F show cross-sectional views, at selected stages of fabrication of a storage node in accordance with a preferred embodiment of the present invention.
Figure 3B:
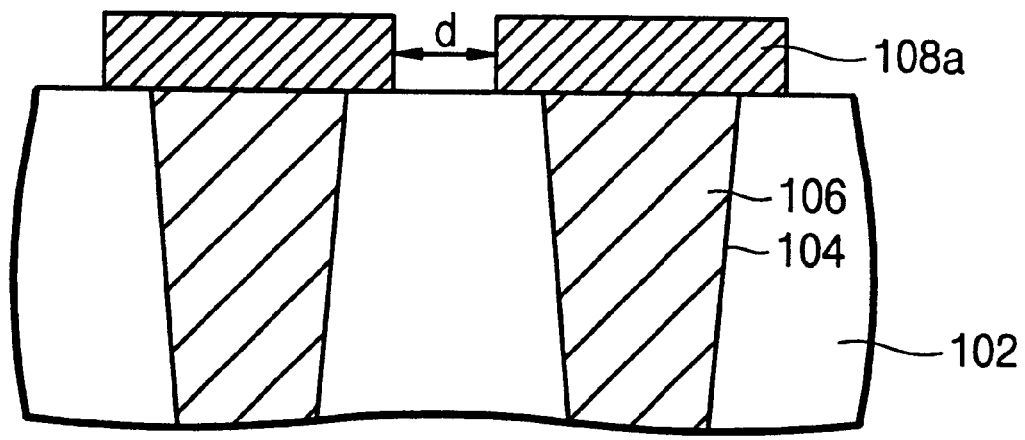
Figure 3C:
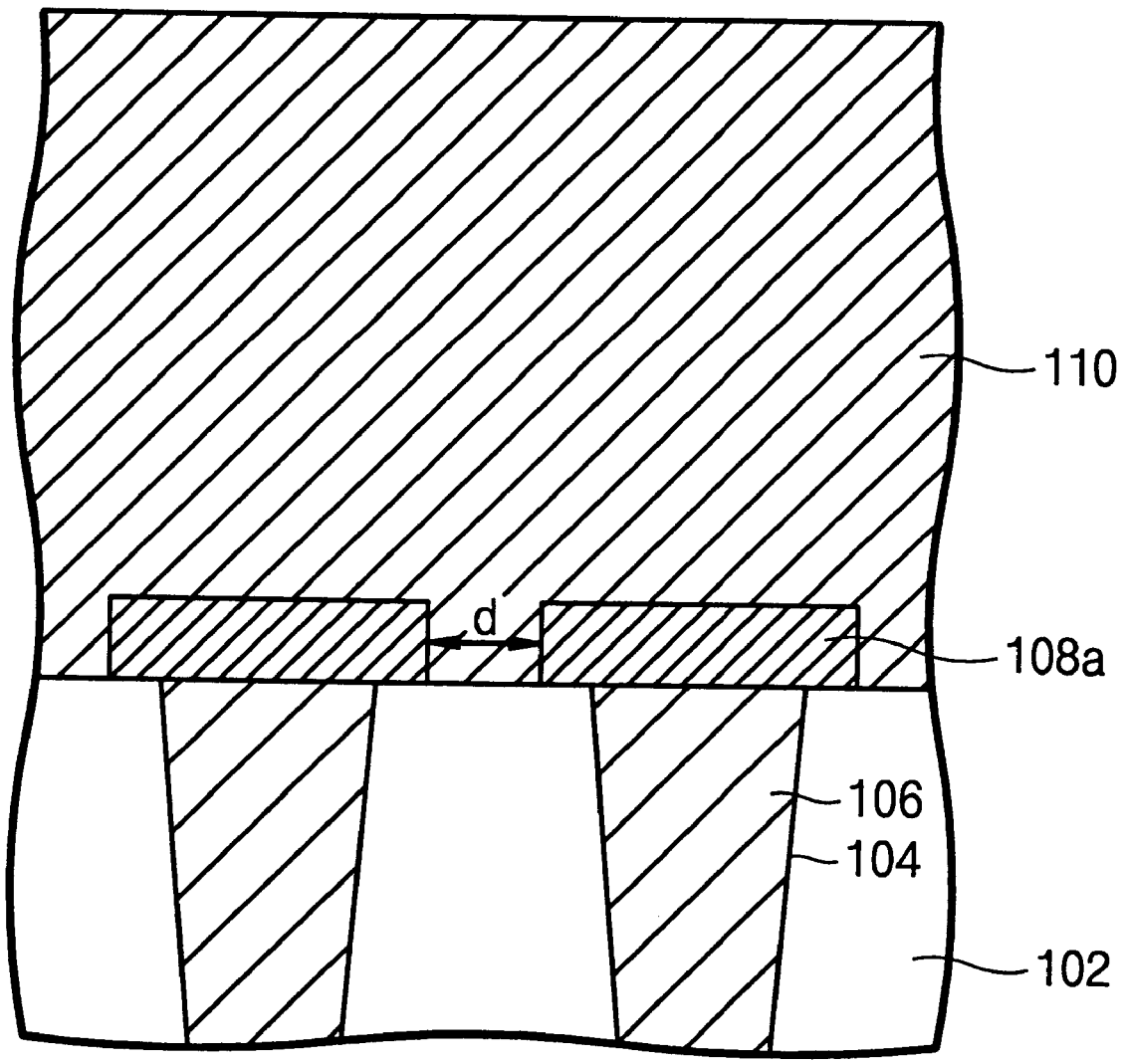
Figure 3D:
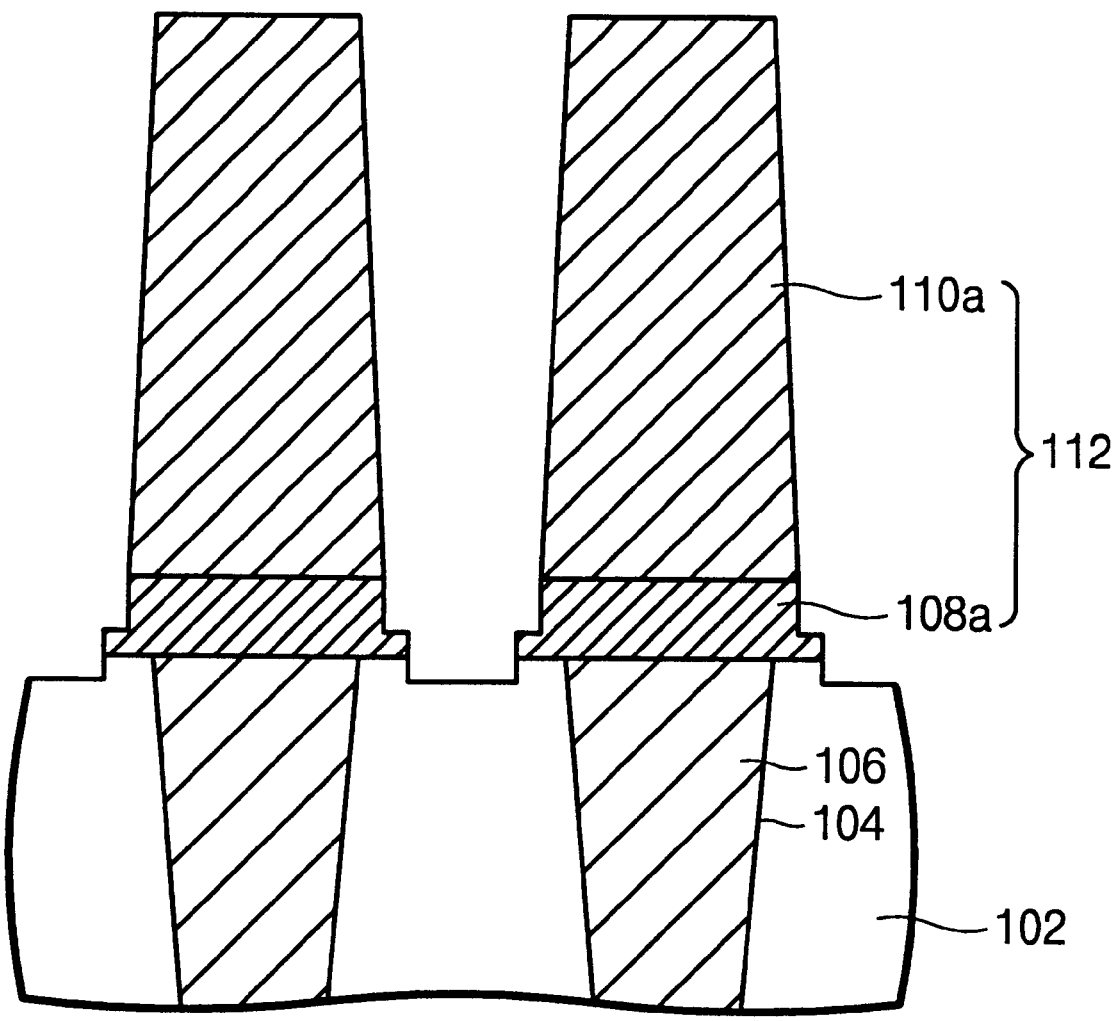
Figure 3E:
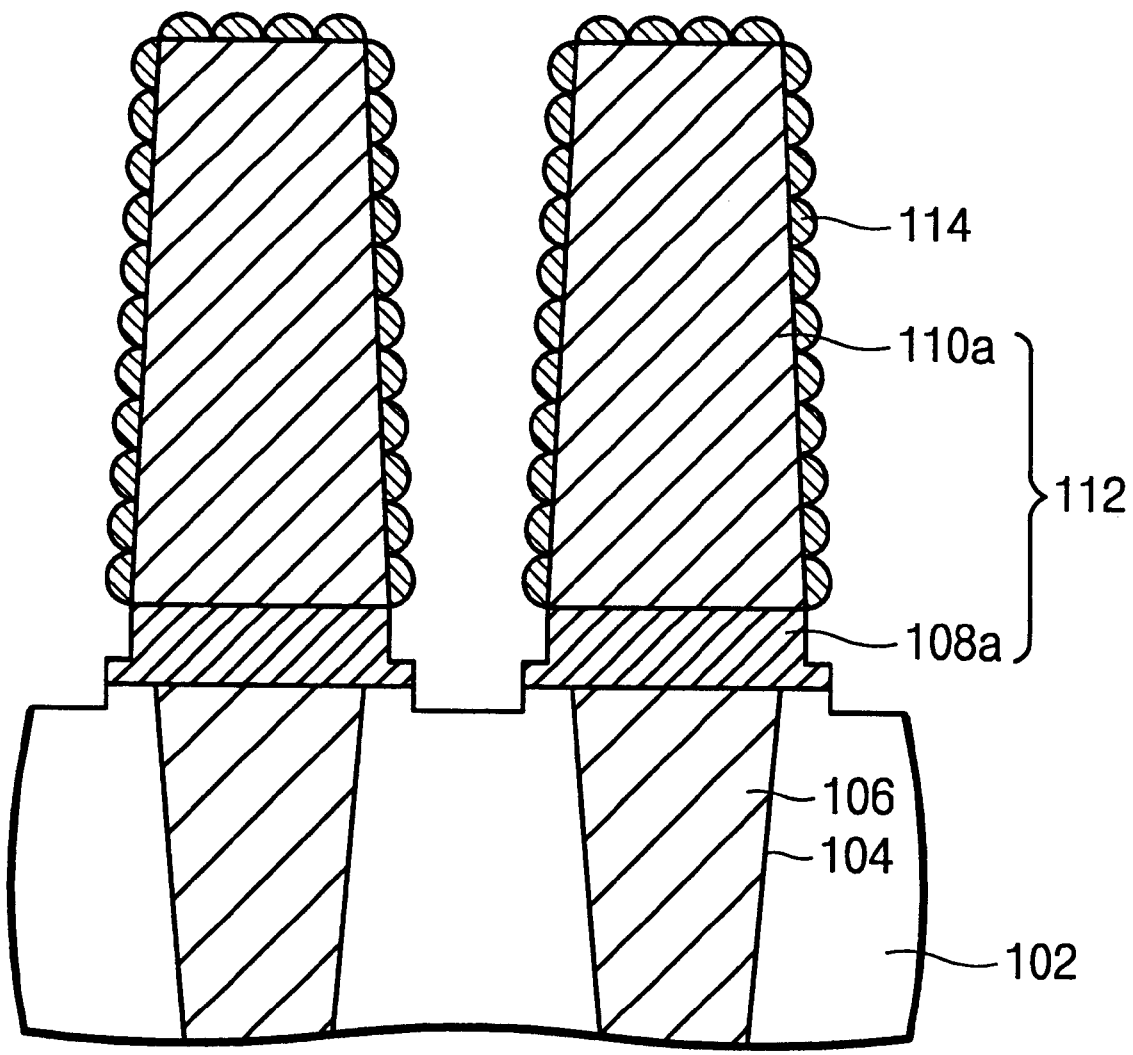
Figure 3F:
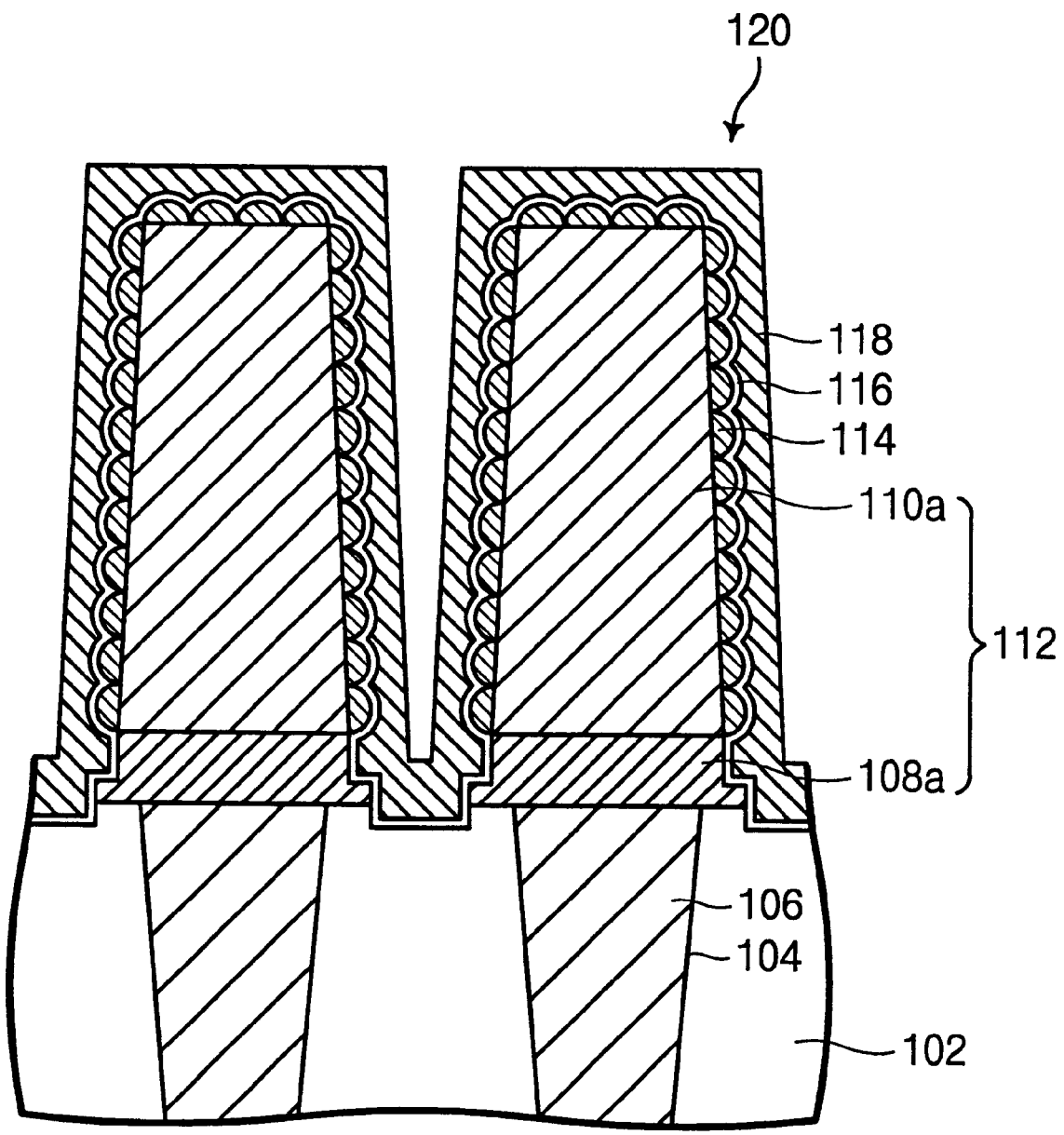

The present invention provides a stacked capacitor having HSG silicon only on a top portion of a storage node, not on a bottom portion thereof as schematically illustrated in FIG. 3F. A stacked capacitor 120 is made of a storage node 112 with HSG silicon 114, a dielectric film 116 and a plate node 118. The storage node is electrically connected to an active region of a semiconductor substrate (not shown) through a contact plug 106 in an interlayer insulating layer 102. As can be seen in FIG. 3F, the storage node is made of a first conductive pattern 108a and a second conductive pattern 110a thereon. HSG silicon 114 is formed only on the second conductive pattern 110a. As a result, the distance between the storage nodes at the bottom portion can be increased. As such, an electrical bridge caused by HSG silicon and falling down of the storage nodes during a cleaning process can be avoided.

The method for fabricating above mentioned stacked capacitor will now be described with reference to FIGS. 3A to 3F. The present invention relates to a method for fabricating a DRAM cell capacitor. Therefore, the process for forming a field oxide layer and a transistor structure as presently practiced in manufacturing DRAM cells are only briefly described in order to better understand the current invention.

FIG. 3A schematically shows a semiconductor topology according to the present invention in which a field oxide layer is formed on a predetermined region of the semiconductor substrate to define active and inactive regions. The transistor is formed on the active region. The transistor is composed of a gate electrode with a capping layer and sidewall spacers, and source and drain regions. As is well known, the transistor is electrically insulated from the active region by a thin gate oxide layer.

An interlayer insulating layer 102 is formed on the resulting structure. Using conventional photolithographic process steps, selected portions of the interlayer insulating layer 102 are etched to form a plurality of contact holes. For clarity, only two contact holes 104 are illustrated on the drawings. Though not shown, the contact hole 104 exposes the source and drain regions. In order to reduce an aspect ratio of the contact hole, a contact pad may be formed.

A conductive material such as polysilicon is deposited on the interlayer insulating layer 102 to completely fill the contact hole 104. The deposited conductive material is then planarized down to a top surface of the interlayer insulating layer 102, thereby forming a contact plug 106.

A first conductive layer 108 for a storage node is then deposited on the interlayer insulting layer 102 and on the contact plug 106. The first conductive layer 108 forms a bottom portion of the storage node where HSG silicon is not formed. The deposited first conductive layer is planarized. The planarized first conductive layer on the interlayer insulating layer has a thickness in the range from about 1,000 angstroms to about 2,000 angstroms. The first conductive layer may be made of amorphous silicon. In this case, in order to suppress the growth of HSG seeds, an annealing process is carried out. The annealing process transforms amorphous silicon into a crystalline structure, i.e., a polysilicon. The annealing process is carried out in a nitrogen ambient at a temperature of about 750° C. for about 10 minutes.

Alternatively, the first conductive layer may be made of polysilicon that suppresses the growth of HSG seeds.

Subsequently, selected portions of the planarized first conductive layer 108 are etched to form a predetermined pattern, i.e., a first conductive pattern 108*a* as shown in FIG. 3B. Since the first conductive layer is thin, a photolithographic process for patterning thereof has wide process margins. Thus, the distance between the adjacent patterns can be about 1,300 angstroms or less. Therefore, the alignment margin to the underlying contact plug can be increased. Furthermore, the later-formed layer for storage node has a different etching characteristic such that problems associated with overetching can be avoided. The annealing process can be performed after the first conductive layer is patterned.

Alternatively, after the formation of the contact hole 104, a conductive material such as polysilicon is deposited in the contact hole 104 and on the interlayer insulating layer 102. The conductive material is then planarized. The planarized conductive material on the interlayer insulating layer 102 has a thickness in the range between about 1,000 angstroms and about 2,000 angstroms. Using a conventional photolithographic process, selected portions of the first conductive layer are etched to form a first conductive pattern on the interlayer insulating layer.

Referring now to FIG. 3C, a second conductive layer 110 is deposited on the interlayer insulating layer 102 and on the first conductive pattern 108*a* to a thickness in the range between 10,000 angstroms and 13,000 angstroms. The second conductive layer 110 is formed of a material, such as amorphous silicon, which allows the growth of HSG seeds. The second conductive layer is then planarized. The planarized second conductive layer has a thickness of about 8,000 angstroms to about 10,000 angstroms.

The second conductive layer 110 is then patterned to form a second conductive pattern 110*a,* defining the storage node 112 together with the underlying first conductive pattern 108*a* as shown in FIG. 3D. In order to avoid a polysilicon tail encountered in the conventional art(see reference number 22 of FIG. 1), overetching is carried out. Since the underlying thin first conductive pattern is formed on the contact plug with sufficient process margins and has a different etching characteristic from the overlying second conductive pattern, a necking phenomenon can be prevented.

More specifically, since the first conductive layer is formed of polysilicon, it is etched less as compared to the second conductive pattern formed of amorphous silicon. During this overetching step, the first conductive pattern and the interlayer insulating layer are etched as illustrated in FIG. 3D. The resulting storage node 112 has a good sidewall profile.

Referring now to FIG. 3E, HSG silicon 114 is formed only on the second conductive pattern 110*a* of the storage node.

Since HSG silicon is not formed on the bottom portion, i.e., the first conductive pattern 108, the distance between adjacent storage nodes can be reduced to about 1,300 angstroms or less without an electrical bridge caused by HSG silicon. More specifically, as the height of the storage nodes increase, the sidewalls thereof tend to have a slope profile. Accordingly, if HSG silicon is formed on the bottom portion, there is a greater possibility of an electrical bridge being formed.

The HSG silicon layer is formed by seeding and growing by heat treatment.

Finally, a dielectric film 116 and a plate node 118 are sequentially formed and patterned into a predetermined configuration 120. The dielectric film may be formed of $Ta_2O_5$.

The plate node may be formed of polysilicon. Subsequently, conventional interconnection and passivation processes are carried out.

The present invention provides a simple stacked capacitor having HSG silicon on its outer surface, not on the bottom portion thereof in order to avoid an electrical bridge between adjacent storage nodes in high density integrated circuit devices.

What is claimed is:

1. A method for fabricating a DRAM cell capacitor on an integrated circuit substrate, the substrate having an interlayer insulating layer thereon, contact plugs being separately buried in the interlayer insulating layer for electrically contacting the substrate, the method comprising:

forming a first conductive layer on the interlayer insulating layer and on the contact plugs;

etching selected portions of the first conductive layer between the contact plugs, thereby forming a first conductive pattern electrically connected to the contact plugs;

forming a second conductive layer on the interlayer insulating layer and on the first conductive pattern;

etching selected portions of the second conductive layer, thereby forming a second conductive pattern, the first and second conductive patterns defining a storage node;

selectively forming an HSG silicon layer on the second conductive pattern;

forming a dielectric film on the entire surface of the semiconductor substrate; and forming a plate node on the dielectric film.

2. The method according to claim 1, wherein the first conductive layer is formed to a thickness in the range from 1,000 angstroms to 2,000 angstroms.

3. The method according to claim 1, wherein the distance between adjacent first conductive patterns is about 1,300 angstroms or less.

4. The method according to claim 1, wherein the first conductive layer is made of a conductive material that suppresses the growth of HSG seeds thereon.

5. The method according to claim 4, wherein the first conductive layer is formed of polysilicon.

6. The method according to claim 4, wherein the step of forming a first conductive layer comprises the steps of:

depositing an amorphous silicon layer on the interlayer insulating layer and on the contact plugs; and annealing the amorphous silicon layer, thereby transforming the amorphous silicon layer into the first conductive layer that suppresses the growth of HSG seeds thereon.

7. The method according to claim 4, wherein the step of forming a first conductive layer comprises depositing an amorphous silicon layer on the interlayer insulating layer and on the contact plugs, wherein the step of etching selected portions of the first conductive layer comprises etching selected portions of the amorphous silicon layer between the contact plugs, thereby forming an amorphous silicon layer pattern electrically connected to the contact plugs, the method further comprising:

annealing the amorphous silicon layer pattern, thereby transforming the amorphous silicon layer pattern into the first conductive pattern that suppresses the growth of HSG seeds thereon.

8. The method according to claim 6, wherein the annealing is carried out in a nitrogen ambient at a temperature of about 750° C. for about 10 minutes.

9. The method according to claim 7, wherein the annealing is carried out in a nitrogen ambient at a temperature of about 750° C. for about 10 minutes.

10. The method according to claim 1, wherein the second conductive layer is formed to a thickness greater than the thickness of the first conductive layer.

11. A method for fabricating a DRAM cell capacitor comprising:

depositing an interlayer insulating layer on a semiconductor substrate;

etching selected portions of the interlayer insulating layer to form contact hole exposing the substrate;

depositing a first conductive layer in the contact holes and on the interlayer insulating layer;

planarizing the first conductive layer;

etching the first conductive layer between the contact holes to form a first conductive pattern;

depositing a second conductive layer on the first conductive pattern and on the interlayer insulating layer;

etching selected portions of the second conductive layer to form a second conductive pattern, the first and second conductive patterns defining a storage node;

selectively forming an HSG silicon layer on the second conductive pattern;

forming a dielectric film on the entire surface of the semiconductor substrate; and forming a plate node on the dielectric film.

12. The method according to claim 11, wherein the first conductive pattern has a predetermined thickness in the range from 1,000 angstroms to 2,000 angstroms.

13. The method according to claim 11, wherein the first conductive layer is made of a conductive material that suppresses the growth of HSG seeds thereon.

14. The method according to claim 13, wherein the first conductive layer is formed of polysilicon.

15. The method according to claim 13, wherein the step of depositing a first conductive layer comprises:

depositing an amorphous silicon layer in the contact holes and on the interlayer insulating layer; and annealing the amorphous silicon layer, thereby transforming the amorphous silicon layer into the first conductive layer that suppresses the growth of HSG seeds thereon.

16. The method according to claim 13, wherein the step of depositing a first conductive layer comprises depositing an amorphous silicon layer on the contact holes and on the interlayer insulating layer, wherein the step of etching the first conductive layer between the contact holes comprises etching the amorphous silicon layer between the contact holes to form an amorphous silicon layer pattern, the method further comprising:

annealing the amorphous silicon layer pattern, thereby transforming the amorphous silicon layer pattern into the first conductive pattern that suppresses the growth of HSG silicon thereon.

17. The method according to claim 15, wherein the annealing is carried out in a nitrogen ambient at a temperature of about 750° C. for about 10 minutes.

18. The method according to claim 16, wherein the annealing is carried out in a nitrogen ambient at a temperature of about 750° C. for about 10 minutes.

19. The method according to claim 11, wherein the distance between adjacent first conductive patterns is about 1,300 angstroms or less.

20. The method according to claim 11, wherein the second conductive layer is formed to a thickness greater than the thickness of the first conductive layer.

21. The method according to claim 11, the dielectric film is formed of $Ta_2O_5$.

* * * * *